United States Patent [19]

Tseng et al.

[11] Patent Number: 5,726,087
[45] Date of Patent: Mar. 10, 1998

[54] METHOD OF FORMATION OF SEMICONDUCTOR GATE DIELECTRIC

[75] Inventors: Hsing-Huang Tseng; Philip J. Tobin, both of Austin, Tex.

[73] Assignee: Motorola, Inc., Schaumburg, Ill.

[21] Appl. No.: 258,360

[22] Filed: Jun. 9, 1994

Related U.S. Application Data

[63] Continuation of Ser. No. 875,959, Apr. 30, 1992, abandoned.

[51] Int. Cl.$^6$ .................................................. H01L 21/318
[52] U.S. Cl. ........................ 438/261; 438/287; 438/591; 438/762; 438/775
[58] Field of Search ............................. 437/235, 236, 437/243, 247, 248, 983; 148/DIG. 43; 438/216, 261, 287, 775, 762, 763, 591

[56] References Cited

U.S. PATENT DOCUMENTS

| | | | |
|---|---|---|---|
| 3,560,810 | 2/1971 | Balk et al. | 257/406 |
| 4,003,071 | 1/1977 | Takagi | 257/406 |
| 4,282,270 | 8/1981 | Nozake et al. | |
| 4,621,277 | 11/1986 | Ito et al. | 257/411 |
| 4,623,912 | 11/1986 | Chang et al. | |
| 4,851,370 | 7/1989 | Doklan et al. | 437/225 |
| 5,034,798 | 7/1991 | Oshima | |
| 5,061,647 | 10/1991 | Roth et al. | |
| 5,104,819 | 4/1992 | Freiberger et al. | 437/43 |
| 5,258,333 | 11/1993 | Shappier et al. | 437/235 |
| 5,286,954 | 2/1994 | Ozawk et al. | 257/411 |
| 5,294,820 | 3/1994 | Geuna et al. | 257/406 |
| 5,397,720 | 3/1995 | Kwong et al. | |
| 5,407,870 | 4/1995 | Okada et al. | |
| 5,464,783 | 11/1995 | Kim et al. | |
| 5,591,681 | 1/1997 | Wristers et al. | |

FOREIGN PATENT DOCUMENTS

| | | |
|---|---|---|
| 58-17673 | 7/1981 | Japan. |
| 56125875 | 10/1981 | Japan. |
| 5817673 | 2/1983 | Japan. |
| 6197866 | 5/1986 | Japan. |
| 2265279 | 10/1990 | Japan ............................... 257/411 |
| 330470 | 2/1991 | Japan. |

OTHER PUBLICATIONS

"Improvement in SiO2 Gate Dielectrics with Fluorine Incorporation," by Wright et al., was published in 1988 via the VLSI Symposium 1988, pp. 51–52.

"Improvement of Thin–Gate Oxide Integrity Using Through–Silicon–Gate Nitrogen Ion Implanting," by Haddad et al., published in IEEE Elect. Dev. Letters, vol. EDL–8, No. 2, Feb. 1987, pp. 58–60.

"Electrical and Reliability Characteristics of Ultrathin Oxynitride Gate Dielectric Prepared by Rapid Thermal Processing in N2O," by Hwang et al., published in IEDM 1990, pp. 421–424.

"Fabrication of Superior Oxynitride Ultrathin MOS Gate dielectrics for ULSI Technology by Rea Rapid Thermal Processing," in SPIE vol. 1189 Rapid Thermal Processing (1989), pp. 186–197.

"Fluorine Enhanced Oxidation of Silicon: Effect of Fluorine on Oxide Stress," by Kouvatsos et al. published in Ext. Abs. of the Electrochem. Soc., vol. 90–2, Fall Meeting, Oct., 1992, pp. 447–448.

Wolf, S. et al., *Silicon Processing for the VLSI Era: vol. 1, Process Technology*, Lattice Press, 1986, p. 183.

(List continued on next page.)

Primary Examiner—George R. Fourson
Attorney, Agent, or Firm—Keith E. Witek

[57] ABSTRACT

A semiconductor dielectric (10) is formed by providing a base layer (12) having a surface. A thin interface layer (13) is formed at the surface of the base layer (12). The thin interface layer has a substantial concentration of one of either nitrogen or fluorine. A thermal oxide layer (14) is formed overlying the interface layer (13). A deposited dielectric layer (16) is formed overlying the thermal oxide layer (14). The deposited dielectric layer (16) is optionally densified by a thermal heat cycle. The deposited dielectric layer (16) has micropores that are misaligned to micropores in the thermal oxide layer (14) to provide enhanced features.

14 Claims, 4 Drawing Sheets

OTHER PUBLICATIONS

Wolf, S., *Silicon Processing for the VLSI Era: vol. 2, Process Integration*, Lattice Press, 1990, pp. 273–275.

Research Disclosure, Nov. 1979, Derwent Publications Ltd.; pp. 862–863 No. 18756.

"Suppression of Boron Penetration into an Ultra–Thin Gate Oxide by Using a Stacked Amorphous–Silicon (SAS) Film", Wu et al., IEEE–EIDM '93, pp. 329–332.

"Nitridation Induced Surface Donor Layer in Silicon and It's Impact on the Characteristics of n–and p–Channel MOSFETs", Wu et al, IEEE–IEDM '89, pp. 271–274.

"Improvements in Rapid Thermal Oxide/Re–Oxidized Nitrided Oxide (ONO) Films Using NF3", Cable et al., 1991 Mat. Res. Soc. Symp. Proc., vol. 224.

Abbas, S., et al., "Improvement of the Gate–Region Integrity in FET Devices", IBM Tech. Disc. Bull. vol. 14, No. 11, Apr. 1972, pp. 3348–3350.

IBM Tech. Disc. Bull., vol. 28, No. 6, Nov. 1985, pp. 2665–2666.

Li, P.C., et al, "Gate Dielectric Structure for Field Effect Transistors" IBM Tech. Disc. Bull vol. 17, No. 8, p. 2330.

"Improvement of Thin–Gate Oxide Integrity Using Through–Silicon–Gate Nitrogen Ion Implantation," IEEE Electron Devices Letters, vol. EDL–8, No. 2, Feb. 1987; Haddad et al.

Wong, S., et al., "Low Pressure Nitrided–Oxide as a thin Gate Dielectric for MOSFETS", J. Electrochem. Soc., vol. 130, No. 5, (1983, May) pp. 1139–1144 (abstract only).

5,726,087

METHOD OF FORMATION OF SEMICONDUCTOR GATE DIELECTRIC

This application is a continuation of prior application Ser. No. 07/875,959, filed Apr. 30, 1992, now abandoned.

FIELD OF THE INVENTION

The present invention relates generally to semiconductor technology, and more particularly, to semiconductor dielectrics.

BACKGROUND OF THE INVENTION

Dielectric materials are frequently used in the formation of integrated circuit devices. Dielectric materials are used to form gate oxides for metal oxide semiconductor field effect transistors (MOSFETs), capacitor dielectrics, inter-polysilicon dielectrics, inter-metal dielectrics, final passivation layers, sacrificial layers, masking layers, and like structures. In most cases, the most critical oxide in an integrated circuit device is the gate oxide.

There are two conventional and widely used methods of forming a gate oxide. Both methods of forming the gate oxide require exposure of a silicon material to an oxygen-containing ambient and elevation of an ambient temperature. A wet silicon dioxide or a dry silicon dioxide material is formed over the silicon material when using this method. Wet and dry oxides are used frequently to form gate oxides. Silicon dioxide materials have several known disadvantages, such as boron penetration between a gate and a channel region, hot carrier injection problems, and a defect density and micropores which cause reduced breakdown voltages and reduced transistor lifetime.

SUMMARY OF THE INVENTION

The previously mentioned disadvantages are overcome and other advantages achieved with the present invention. The present invention comprises a semiconductor dielectric and several methods which may be used to form the semiconductor dielectric. In one form, the semiconductor dielectric is formed overlying a base layer. The semiconductor dielectric has a thin interface region overlying the base layer. A thermal oxide layer is formed overlying the thin interface region. A deposited dielectric is formed overlying the thermal oxide layer.

The present invention will be more clearly understood from the detailed description below in conjunction with the accompanying drawings.

DESCRIPTION OF THE PREFERRED EMBODIMENT

Figure 1:
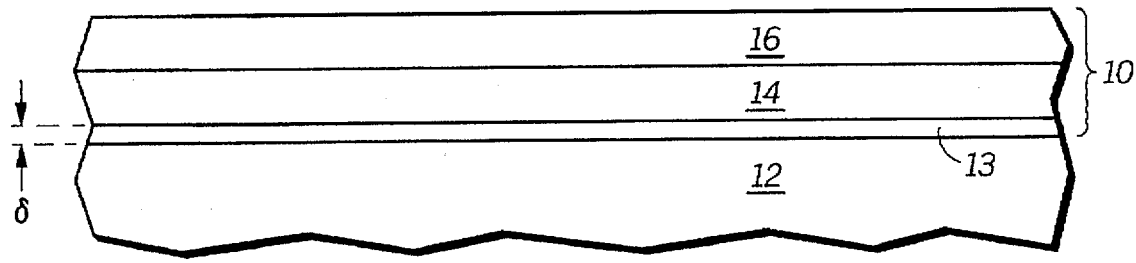
FIG. 1 illustrates, in cross-sectional form, a semiconductor dielectric in accordance with the present invention.

Illustrated in FIG. 1 is a semiconductor dielectric 10. In order to form semiconductor dielectric 10, a base layer 12 which has a surface is provided. In most cases, the base layer 12 is a substrate material. Substrate materials include but are not limited to silicon, gallium arsenide, silicon on sapphire, epitaxial formations, germanium, germanium silicon, polysilicon, and/or like substrate materials. In other cases, the base layer may be a transistor gate electrode, a transistor floating gate material for a memory cell, a polysilicon interconnect or layer, amorphous silicon, or a like conductive material. If semiconductor dielectric 10 is formed over a dielectric layer, then the dielectric layer is a base layer. It is important to note that the semiconductor dielectric 10 may be formed either over a base layer or under a base layer.

In one form, an oxynitride layer is formed overlying the base layer 12. The oxynitride layer forms a thin interface region referred to as a thin interface layer 13 at the surface of the base layer 12. The thin interface layer 13 has a substantial or detectable concentration of nitrogen. The thin interface layer 13 is labeled in FIG. 1 as having a thickness $\delta$. The thickness $\delta$ indicates that the interface layer 13 is a thin layer. The thickness $\delta$ is used in subsequent figures to represent a thin layer or a thin region. The oxynitride layer also forms a thermal oxide layer 14. The thermal oxide layer 14 is preferably either a wet or dry silicon dioxide ($SiO_2$) material.

A deposited dielectric layer 16 is formed overlying the thermal oxide layer 14. Chemical vapor deposition (CVD), plasma enhanced chemical vapor deposition (PECVD), low pressure chemical vapor deposition (LPCVD), or a like deposition process is used to form the deposited dielectric layer 16. Many dielectric materials which are formed via deposition are known, but a high temperature oxide (HTO) or a tetraethylorthosilicate (TEOS) based oxide is preferred for the dielectric layer 16. In addition, a low temperature oxide (LTO) may be used although an LTO may not be as dense or defect-free as an HTO or a TEOS oxide. Subsequent to formation or during formation, the dielectric layer 16 is heated to densify the deposited dielectric layer 16. Densification of the deposited dielectric layer 16 is not always necessary, but will result in a deposited dielectric layer 16 of improved quality.

The semiconductor dielectric 10 of FIG. 1 may be formed via a different method. Instead of using an oxynitride material to form the layers 13 and 14, a fluorinated layer is used to form the layers 13 and 14. In FIG. 1, the base layer is exposed to an ambient containing $O_2$ and $NF_3$ or a like fluorine and oxygen containing ambient. Due to the fluorine and oxygen in the ambient, the thin interface layer 13 is formed as a thin region with a thickness of $\delta$. The interface layer 13 contains a substantial or detectable concentration of fluorine. The thermal oxide layer 14 forms in a manner that is similar to the oxynitride method discussed above. The deposited dielectric layer 16 is formed and optionally densified as described above, and the semiconductor dielectric 10 is complete.

The thin interface layer 13, which has either a high concentration of nitrogen or fluorine allows semiconductor dielectric 10 to be more radiation hard than most known dielectric materials. In addition, the semiconductor dielectric 10, if the thin interface layer 13 is made primarily of nitrogen, reduces or eliminates a known boron penetration problem. Stress is reduced between the base layer 12 and the semiconductor dielectric 10 via the thin interface layer 13. The semiconductor dielectric 10, due to the combination of the deposited dielectric layer 16 and the thermal oxide layer 14, improves oxide integrity, reduces oxide leakage, reduces breakdown voltage failures, and improves integrated circuit lifetime. These advantages are achieved by the fact that the combination of the deposited dielectric layer 16 and the thermal oxide layer 14 reduces the effects of micropores. This phenomenon is discussed in more detail in reference to a subsequent figure.

In subsequent figures, elements that are analogous to elements in FIG. 1 are labeled identically.

Figure 2:
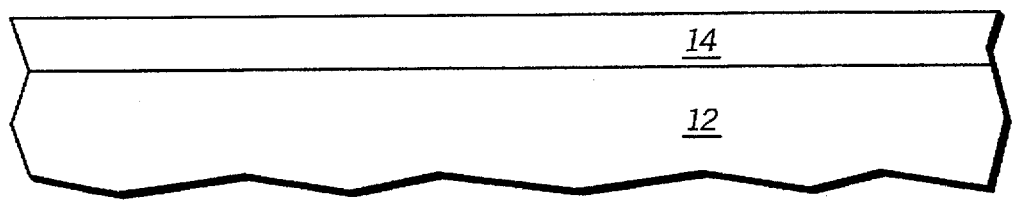
FIGS. 2–3 illustrate, in cross-sectional form, a method of forming a semiconductor dielectric in accordance with the present invention.
Figure 3:
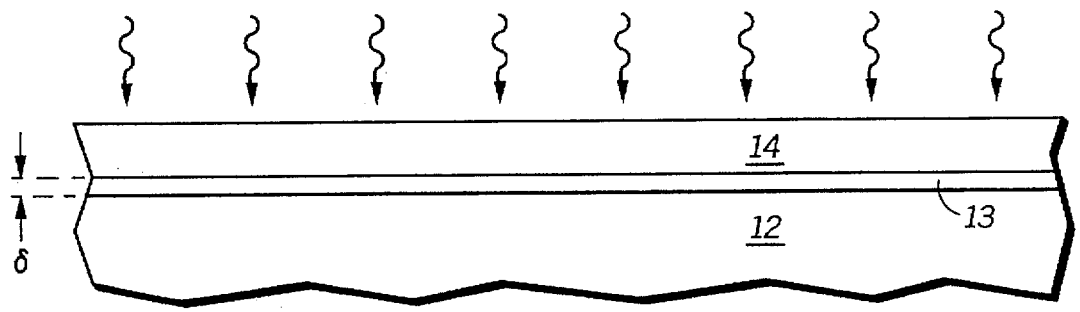

FIGS. 2–3 illustrate an alternative method that may be used to form the semiconductor dielectric 10. In FIG. 2, the thermal oxide layer 14 is grown over the base layer 12 which has a surface. Wet or dry techniques may be used to form the thermal oxide layer 14 as a silicon dioxide layer.

In FIG. 3, the thermal oxide layer 14 is exposed to an ambient which contains one of either $N_2O$ or $NH_3$, or a like nitrogen containing ambient, to form the thin interface layer 13 which has a substantial concentration of nitrogen. The nitrogen diffuses to the surface of the base layer 12 and "piles up" to form the thin interface layer 13. Although not illustrated in FIG. 3, deposited dielectric layer 16 is formed and optionally densified over the thermal oxide layer 14 in FIG. 3 to form the semiconductor dielectric 10 of FIG. 1.

In FIG. 3, an ambient of $NF_3$ or a like fluorine-containing ambient may be used in a similar manner to form an interface layer 13 with a substantial concentration of fluorine.

Figure 4:
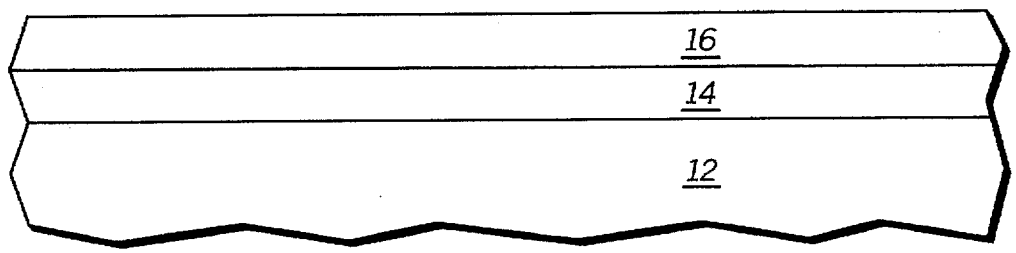
FIGS. 4–5 illustrate, in cross-sectional form, another method of forming a semiconductor dielectric in accordance with the present invention.
Figure 5:
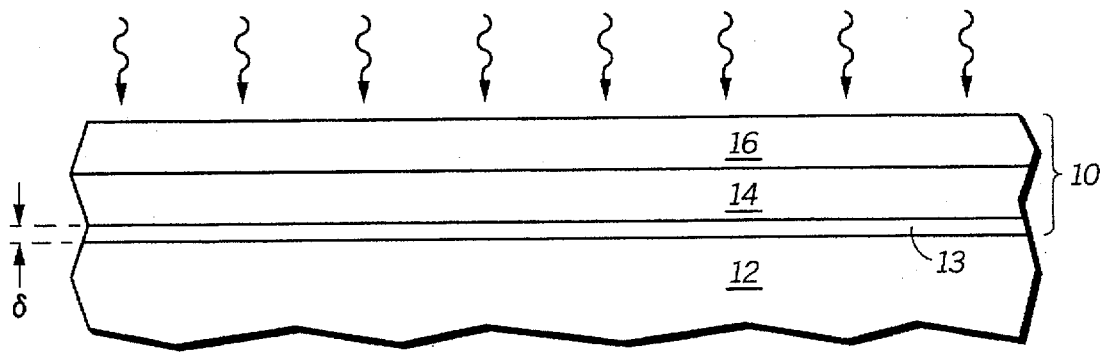

In FIGS. 4–5, yet another method for forming the semiconductor dielectric 10 of FIG. 1 is illustrated. In FIG. 4, both the thermal oxide layer 14 and the deposited dielectric layer 16 are formed. In FIG. 5, the dielectric layer 16 is exposed to an ambient which contains one of either $N_2O$ or $NH_3$, or a like nitrogen containing ambient, to form the thin interface layer 13 that has a substantial concentration of nitrogen. Although not illustrated in FIG. 3, the deposited dielectric layer 16 is optionally densified as described herein.

In FIG. 5, an ambient of $NF_3$ or a like fluorine-containing ambient may be used in a similar manner to form the thin interface layer 13 with a substantial concentration of fluorine.

Figure 6:
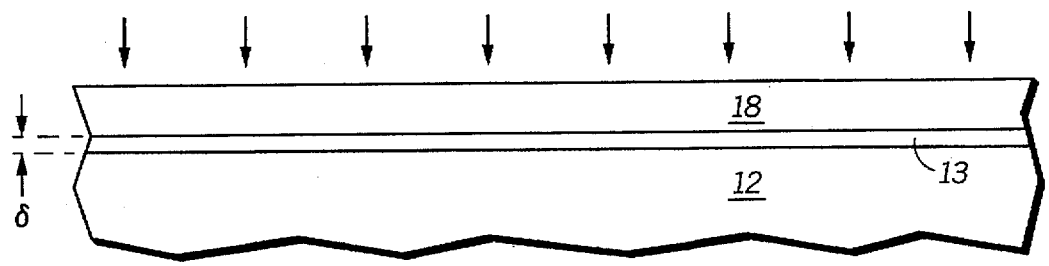
FIGS. 6–7 illustrate, in cross-sectional form, yet another method of forming a semiconductor dielectric in accordance with the present invention.
Figure 7:
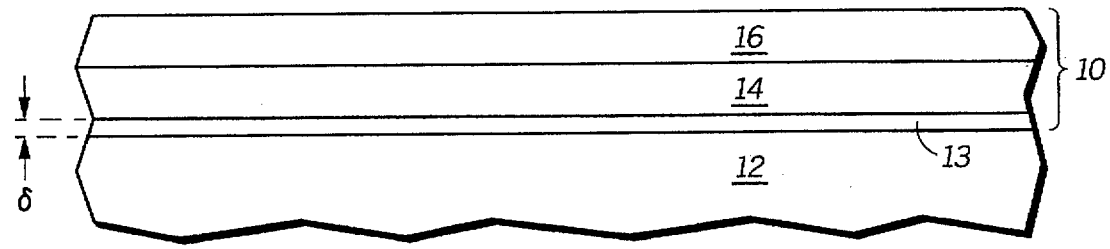

In FIGS. 6–7, an ion implantation method of forming the thin interface layer 13 is illustrated. In FIG. 6, a sacrificial dielectric layer 18 is formed over the base layer 12. The thin interface layer 13 does not exist before the formation of the sacrificial dielectric layer 18. An ion implantation step is used to ion implant either nitrogen, fluorine, a nitrogen-containing compound, or a fluorine-containing compound into a region that is near a surface of the base layer 12. The implantation along with an optional heat cycle forms the thin interface layer 13 between the sacrificial dielectric layer 18 and the base layer 12. The sacrificial dielectric layer 18 is then removed via conventional etch procedures.

In FIG. 7, the thermal oxide layer 14 and the deposited dielectric layer 16 are formed as discussed herein. The layers 14 and 16 are formed over the thin interface layer 13.

Figure 8:
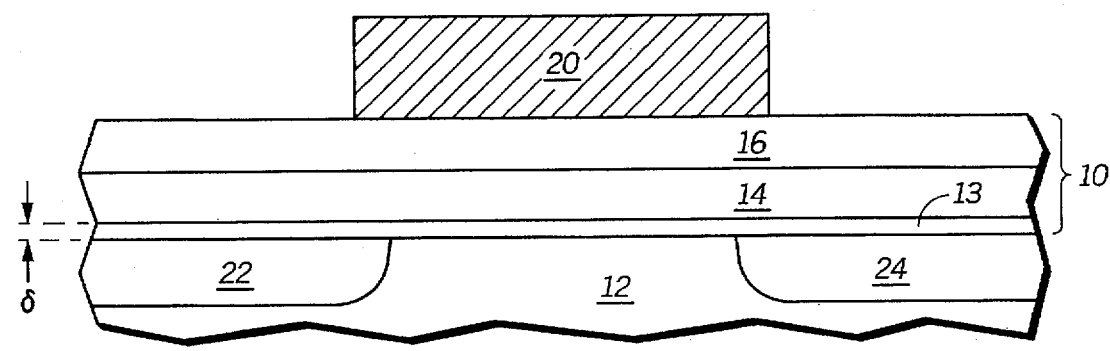
FIG. 8 illustrates, in cross-sectional form, the semiconductor dielectric of FIG. 1 being used as a transistor gate dielectric.

In FIG. 8, the semiconductor dielectric 10 of FIG. 1 is used as a gate oxide for a field effect transistor (FET). The layers 13, 14, and 16 are formed as described above. The base layer 12 is a silicon substrate. A gate electrode 20 is formed overlying the deposited dielectric layer 16 via conventional techniques. A source electrode 22 and a drain electrode 24 are formed using conventional processing techniques. The layers 13 and 14 reduce boron penetration between the gate electrode 20 and the base layer 12 when layers 13 and 14 contain nitrogen, reduce stress between the layer 14 and the base layer 12, increase transistor lifetime, increase transistor radiation hardening, reduce breakdown voltage failures, and/or reduce leakage current through layers 13, 14, and 16.

Furthermore, the layers 13, 14, and 16 may be used to form a gate oxide for an electrically erasable programmable read only memory (EEPROM) or an erasable programmable read only memory (EPROM). The gate oxide is used to program or erase a floating gate via known tunneling or known hot carrier injection of electrical carriers. A set of layers (not illustrated) similar to the layers 13, 14, and 16 are optionally used to insulate a floating gate from a control gate. The set of layers (not illustrated) are formed overlying an upper surface and adjacent a sidewall of the floating gate in order to insulate the floating gate from the control gate.

Figure 9:
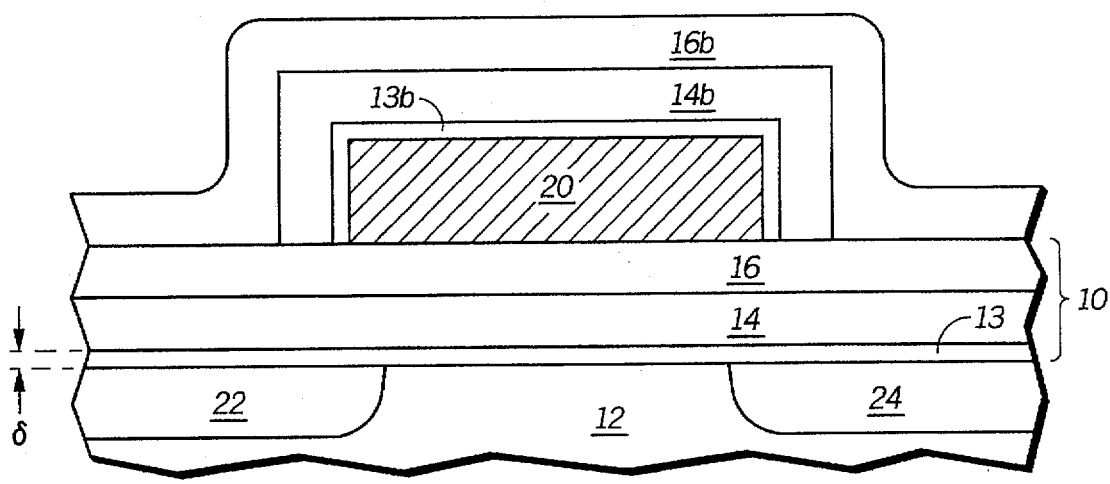
FIG. 9 illustrates, in cross-sectional form, the semiconductor dielectric of FIG. 1 being used to insulate a transistor gate electrode.

In FIG. 9, the transistor of FIG. 8 is illustrated with additional materials overlying the gate electrode 20. In FIG. 9, a transistor is formed as described in reference to FIG. 8 with semiconductor dielectric 10 functioning as a gate dielectric. The gate electrode 20, if made of a silicon-based material, is processed as a base layer via one of the methods described in reference to FIGS. 1–7. This processing forms a thin interface layer 13b which is overlying and surrounding all exposed surfaces of the gate electrode 20. Thin interface layer 13b is formed in a manner similar to thin interface layer 13. A thermal oxide layer 14b is then formed overlying thin interface layer 13b in a manner that is similar to the formation of thermal oxide layer 14. A deposited dielectric layer 16b is formed overlying the thermal oxide layer 14b in a manner that is similar to the formation of deposited dielectric layer 16. The layers 13b, 14b, and 16b are formed to prevent boron penetration into or out from the gate electrode 20. In addition, stress exerted on the transistor is reduced.

Figure 10:
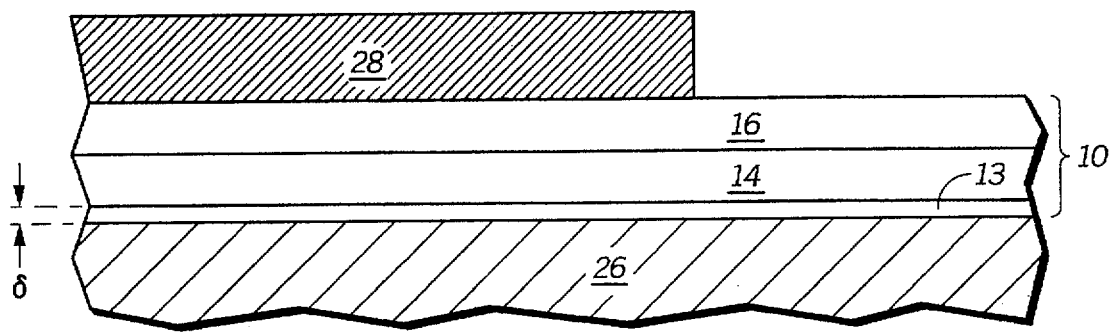
FIG. 10 illustrates, in cross-sectional form, the semiconductor dielectric of FIG. 1 being used to insulate a first conductive layer from a second conductive layer.

FIG. 10 illustrates semiconductor dielectric layer 10 which is used as either an inter-polysilicon dielectric layer or an inter-conductor dielectric layer. In FIG. 10, semiconductor dielectric 10 is used to isolate a base layer 26, which is a silicon-based material, from a conductive layer 28. Conductive layer 28 may be either a salicided material, a silicided material, polysilicon, amorphous silicon, single-crystalline silicon, metal, epitaxial silicon, germanium silicon, or a like conductive material. Therefore, the semiconductor dielectric 10 in FIG. 10 is used to isolate a first conductor from a second conductor.

Figure 11:
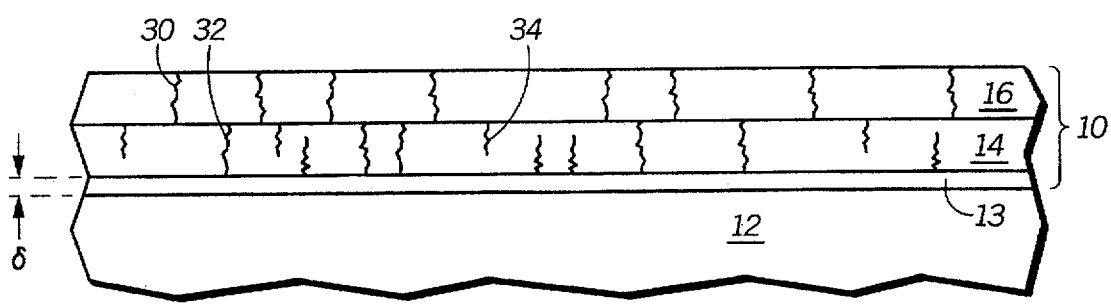
FIG. 11 illustrates, in cross-sectional form, micropore formation in the semiconductor dielectric of FIG. 1.

FIG. 11 illustrates how dielectric layer 10 is able to reduce breakdown voltage failures, reduce leakage, and increase lifetime of integrated circuits. FIG. 11 is a more detailed illustration of FIG. 1. FIG. 11 illustrates base layer 12, the interface layer 13, thermal oxide layer 14, and deposited dielectric layer 16. When any dielectric layer is formed, especially a gate oxide or any other thin oxide, a defect known as a micropore is usually formed. Micropores, such as micropores 30, 32, and 34, are illustrated in FIG. 11. Other micropores are illustrated in FIG. 11, but are not labeled. Micropores are defects that occur in thin oxide layers. Many of the micropores form completely from a top surface of a thin oxide layer to a bottom surface of the thin oxide layer, as illustrated via micropores 30 and 32. In some cases, the micropores may only partially form through an oxide layer as illustrated via micropore 34. The micropores that run completely through an oxide layer are defects that increase breakdown voltage problems, decrease integrated circuit lifetime, and increase leakage current.

The formation of thermal oxide layer 14 results in micropores in the thermal oxide layer 14. The formation and optional densification of the deposited dielectric layer 16 forms micropores in the deposited dielectric layer 16. The micropores in the layer 14 are most likely not aligned with the micropores in the layer 16 as illustrated. Therefore, a large number of micropores will not run entirely through the semiconductor dielectric 10. The misalignment of defects or misalignment of micropores results in semiconductor dielectric 10 being more robust than conventional dielectrics and having reduced breakdown voltage problems, reduced integrated circuit lifetime, and reduced leakage current as described herein.

Figure 12:
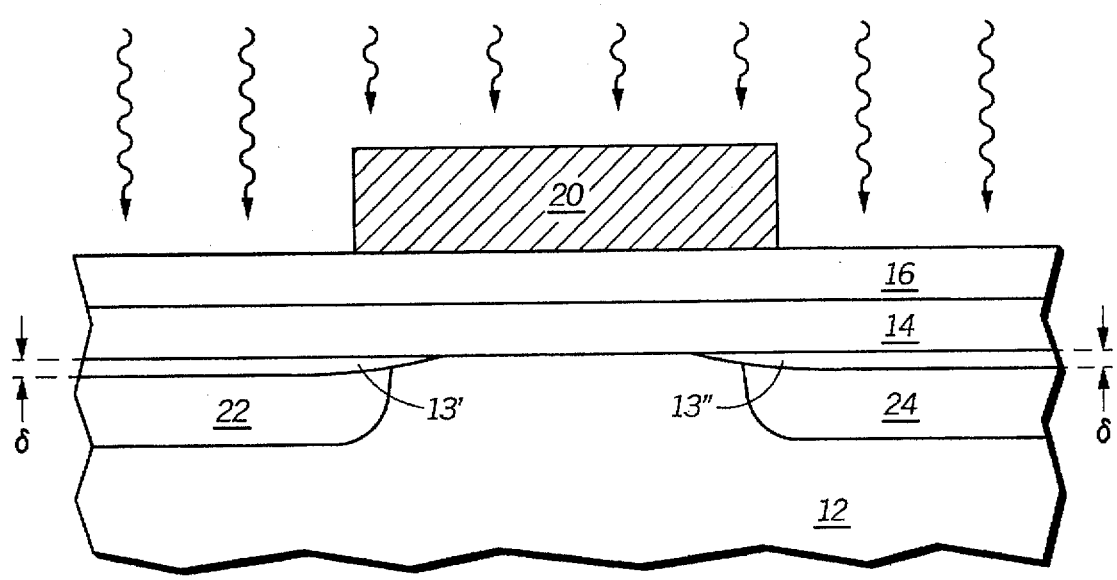
FIG. 12 illustrates, in cross-sectional form, selective formation of a barrier region adjacent a transistor gate, the formation being in accordance with the present invention.

FIG. 12 illustrates a structure having selective formation of a thin interface region. In FIG. 12, or base layer 12 is provided. In a preferred form, the base layer 12 is a substrate made of silicon. Thermal oxide layer 14 and deposited dielectric layer 16 are formed overlying the base layer 12. Gate electrode 20, source electrode 22, and drain electrode 24 are formed in a conventional manner to form a transistor. The transistor is exposed to either a fluorine-containing or a nitrogen-containing ambient while being heated. Thin interface regions 13' and 13" containing a detectable concentration of either nitrogen or fluorine are formed adjacent the gate electrode 20. Thin interface regions 13' and 13" are similar to the thin interface region 13 discussed herein for FIGS. 1–11. The thin interface regions 13' and 13" are formed at a surface of the base layer 12 and are underlying the thermal oxide layer 14. The extent to which the thin interface regions 13' and 13" extend under the gate electrode will vary based on processing parameters and transistor materials.

It is important to note that the figures presented herein are not drawn to scale. The figures may exaggerate specific features in order to better illustrate thin layers or regions.

In summary, an improved semiconductor dielectric and processing steps for the formation thereof are taught herein. The inventive semiconductor dielectric results in reduced stress, improved integrated circuit lifetime, reduced breakdown voltage failures, reduced boron penetration, improved radiation hardening, and reduced micropore-related problems. The semiconductor dielectric can be used, for example, as a gate dielectric or an inter-conductor dielectric.

While the present invention has been illustrated and described with reference to specific embodiments, further modifications and improvements will occur to those skilled in the art. For example, the improved semiconductor dielectric can be used to protect any type of transistor or may be used to form a gate dielectric for any transistor. Lightly doped drain (LDD) regions, elevated source and drain regions, and other known structures may be used with the improved semiconductor dielectric. The thin interface layers 13, 13', 13", and/or 13b described herein can be used for other forms of protection. The thin interface layers 13, 13', 13", and 13b can be used to protect underlying layers from hydrogen diffusion. Hydrogen diffusion may occur during passivation, epitaxial growth, or other processing steps. The improved semiconductor dielectric may also be used to protect and insulate thin film transistors (TFTs), silicon on insulator (SOI) transistors, or other silicon based devices. There are many ways to expose a surface of a base layer to one of either nitrogen or fluorine to form a thin interface layer. Many dielectric materials may be used to form the deposited dielectric layer 16 described herein. It is to be understood, therefore, that this invention is not limited to the particular forms illustrated and that it is intended in the appended claims to cover all modifications that do not depart from the spirit and scope of this invention.

We claim:

1. A method for forming a semiconductor gate dielectric comprising the steps of:

providing a base layer having a surface;

exposing the base layer to an elevated temperature wherein the elevated temperature is at least 50° C. above room temperature;

simultaneously exposing the base layer to an environment containing oxygen while at the elevated temperature;

growing a thermal oxide from the base layer in response to the elevated temperature and exposure to the environment;

exposing the thermal oxide to a nitrogen containing environment to form an oxynitride from the thermal oxide, wherein the step of exposing the thermal oxide to a nitrogen containing environment occurs during a same time that the base layer is exposed to the environment containing oxygen so that nitrogen is incorporated into the thermal oxide to form the oxynitride layer while the thermal oxide is being grown whereby an oxynitride layer is formed on and in contact with the base layer, the oxynitride layer comprising both a nitrogen interface region at the surface of the base layer which has a nitrogen concentration and a dielectric region which overlies the nitrogen interface region and has a nitrogen concentration which is less than the nitrogen concentration of the nitrogen interface region, the nitrogen concentration of the nitrogen interface region being greater than a concentration of nitrogen at a top surface of the oxynitride layer; and forming a deposited dielectric layer overlying the first dielectric region, the deposited dielectric being a deposited oxide layer.

2. The method of claim 1 wherein the base layer is formed of a material selected from a group consisting of: polysilicon, epitaxial silicon, amorphous silicon, and single crystalline silicon substrate material.

3. The method of claim 1 further comprising the step of:

densifying the deposited dielectric layer by heating the deposited dielectric layer.

4. The method of claim 1 wherein the step of forming the oxynitride layer comprises thermally growing a thermal oxide to form a portion of the oxynitride layer, wherein the thermal growing of the thermal oxide consumes a surface portion of the base layer.

5. The method of claim 1, wherein the oxynitride layer contains a plurality of micropores and the deposited dielectric layer contains a plurality of micropores that are misaligned to each other to reduce dielectric breakdown potential.

6. A method for forming a semiconductor gate dielectric comprising the steps of:

providing a silicon-containing layer having a surface;

exposing the silicon-containing layer to an elevated temperature wherein the elevated temperature is at least 50° C. above room temperature;

simultaneously exposing the silicon-containing layer to an environment containing oxygen while at the elevated temperature;

growing a thermal oxide from the silicon-containing layer in response to the elevated temperature and exposure to the environment;

exposing the thermal oxide to a nitrogen containing environment to form an oxynitride from the thermal oxide wherein the step of exposing the thermal oxide to a nitrogen containing environment occurs during a same time that the silicon-containing layer is exposed to the environment containing oxygen so that nitrogen is incorporated into the thermal oxide to form the oxynitride layer while the thermal oxide is being grown whereby an oxynitride layer is formed on and in contact with the silicon-containing layer, the oxynitride layer comprising both a nitrogen interface region at the surface of the silicon-containing layer which has a nitrogen concentration and a dielectric region which overlies the nitrogen interface region and has a nitrogen concentration which is less than the nitrogen concentration of the nitrogen interface region, the dielectric region of the oxynitride layer being a thermally grown layer, the oxynitride layer having micropores; and forming a deposited dielectric layer overlying the first dielectric region the deposited dielectric layer having micropores that are misaligned to the micropores of the oxynitride layer.

7. The method of claim 6, wherein the silicon-containing layer is formed of a material selected from a group consisting of: polysilicon, epitaxial silicon, amorphous silicon, and single crystalline silicon substrate material.

8. The method of claim 6 further comprising the step of:

densifying the deposited dielectric layer by heating the deposited dielectric layer to a temperature above room temperature.

9. A method for forming a semiconductor gate dielectric comprising the steps of:

providing a silicon-containing layer having a surface;

forming an oxynitride layer on and in contact with the silicon-containing layer, the oxynitride layer comprising both a nitrogen interface region at the surface of the silicon-containing layer which has a nitrogen concentration and a dielectric region which overlies the nitrogen interface region and has a nitrogen concentration which is less than the nitrogen concentration of the nitrogen interface region, the dielectric region of the oxynitride layer being a thermally grown layer;

forming a deposited dielectric layer overlying the oxynitride layer wherein the deposited dielectric layer is formed by a tetraethlyorthosilicate (TEOS) chemical vapor deposition (CVD) process, the deposited dielectric layer and the oxynitride layer having a common interface wherein a nitrogen concentration at this common interface is less than the nitrogen concentration of the nitrogen interface region; and forming a polysilicon gate electrode overlying a top portion of the deposited dielectric layer, wherein the nitrogen interface region is formed so that the nitrogen interface region is not directly in contact with a portion of the polysilicon gate electrode.

10. The method of claim 9 further comprising the steps of:

forming the polysilicon gate electrode as a floating gate which stores charge for a floating gate memory cell.

11. The method of claim 9 further comprising the step of:

densifying the deposited dielectric layer by heating the deposited dielectric layer to a temperature above room temperature.

12. The method of claim 9 further comprising the step of:

ion implanting dopant atoms into the oxynitride layer.

13. The method of claim 12 wherein the step of ion implanting further comprises:

ion implanting nitrogen atoms into the oxynitride layer to form the nitrogen interface region.

14. The method of claim 9 wherein the step of forming an oxynitride layer further comprises:

using a nitrogen-containing gaseous ambient to form nitrogen at the nitrogen interface region.

* * * * *